United States Patent [19]

Shughart

[11] 3,889,337

[45] June 17, 1975

[54] LOCATOR FOR APPLICATORS ADAPTED TO APPLY ELECTRICAL CONNECTORS TO PRINTED CIRCUIT BOARDS

[75] Inventor: Mervin Leonard Shughart, Carlisle, Pa.

[73] Assignee: AMP Incorporated, Harrisburg, Pa.

[22] Filed: May 17, 1974

[21] Appl. No.: 471,075

[52] U.S. Cl. .............................. 29/203 B; 29/203 P
[51] Int. Cl. .............................. H05k 13/04
[58] Field of Search ........... 29/203 B, 203 P, 203 R, 29/200 P

[56] References Cited

UNITED STATES PATENTS 3,699,631 10/1972 Shughart .......................... 29/203 B

*Primary Examiner*—Thomas H. Eager
*Attorney, Agent, or Firm*—William J. Keating; Jay L. Seitchik; F. W. Raring

[57] ABSTRACT

A locator adapted to locate an aperture in a printed circuit board with respect to an electrical connector applicator. The locator includes a shiftable pin mounted within a tube, the pin being biased into its locating position by compressed air, the compressed air also serving to blow out any undesirable material which may be located in the tube within which the pin shifts. The pin maintains constant force on the ends of the electrical connector as it is applied through and beyond the aperture in the printed circuit board and the tube serves to stabilize that portion of the connector which extends beyond the printed circuit board.

12 Claims, 3 Drawing Figures

LOCATOR FOR APPLICATORS ADAPTED TO APPLY ELECTRICAL CONNECTORS TO PRINTED CIRCUIT BOARDS

FIELD OF THE INVENTION

This invention relates generally to apparatus for applying electrical connectors or the like to printed circuit boards, and more particularly, to a locator adapted to locate an aperture in a printed circuit board with respect to the connector applicator.

BACKGROUND OF THE INVENTION

When applying a connector to an apertured printed circuit board, the connector having a portion which is adapted to pass through and extend beyond the aperture in the printed circuit board, it is desirable to locate the aperture in the printed circuit board with respect to the connector applicator and also to support that portion of the connector which extends beyond the printed circuit board in order to prevent bending or other damage to that portion of the connector. In U.S. Pat. No. 3,699,631 issued Oct. 24, 1972 to Mervin L. Shughart, a locator is shown having a pin shiftable within a tube, the pin being biased to an extended position by means of a compression spring. In the operation of the prior art type of locator, the pin will normally be extended to its locating position wherein a portion of the pin projects beyond one end of the tube, this portion of the pin engaging an aperture in a printed circuit board to which a connector is to be applied. As the connector is applied, a portion of the connector will extend through and beyond the aperture in the printed circuit board forcing the pin downwardly against the pin, the tube about the pin stabilizing that portion of the connector. While the prior art design has performed in a generally satisfactory manner it has several inherent disadvantages. Thus, as the connector is applied through the printed circuit board, the spring force will increase as the connector moves towards its fully inserted position. This may cause the leading end of very delicate connectors to be damaged, and also makes it difficult to withdraw a connector laterally of the support tube as the spring force exerted upon the leading end of the connector may cause the connector to be bent as it is shifted laterally of the support tube. A further disadvantage of this prior art construction is that no means are provided to clean the tube. Thus, as the connector is inserted through the aperture in the printed circuit board it may cause some residue material of the printed circuit board to be forced into the tubes. If such residue or other undesirable matter accumulates within the tube, the locator means will not perform in a satisfactory manner.

OBJECTS AND SUMMARY OF THE INVENTION

It is an object of the present invention to provide a locator suitable for locating printed circuit boards with respect to a connector applicator that will not damage fragile connectors, that will prevent trapping of the connectors, and will be self-cleaning.

More specifically, it is an object of the present invention to provide a locating pin which is held in its raised position by air pressure, the fit of the pin in its support being so designed to allow a small amount of air to leak around the pin to provide a self-cleaning action by blowing the printed circuit board residue and other undesirable matter out of the pin support.

It is a further object of the present invention to provide a locator which is biased to its extended position by air pressure, and which maintains a substantially constant pressure on the end of the connector which contacts the locator as it is being inserted into the printed circuit board to prevent damage to the end of the connector and also to facilitate removal of the end of the connector from the locator.

It is a further object of the present invention to provide a locator normally biased to an extended position which can be retracted after a connector has been inserted in the printed circuit board to prevent damage to the connector as it is being removed from the locator.

The foregoing objects are accomplished in one preferred form of the invention by providing an apertured support member having pin means reciprocal therein between raised and lowered positions, a portion of the pin means extending beyond the upper end of the support member when the pin is in the raised position to facilitate locating an aperture of a printed circuit board relative to an applicator. One end of the pin means is secured to piston means reciprocal in a cylindrical recess of a mounting block. Means are provided to selectively interconnect a source of compressed air with the cylindrical recess. There is clearance between the piston means and the cylindrical recess and also clearance between the pin means and the support members so that when the source of compressed air is operatively interconnected with the cylindrical recess the pin means will be biased towards the extended position and additional air will flow between the piston means and the side walls of the cylindrical recess and also between the pin means and the side walls of the aperture within the support member to blow any residue out of the support member, the compressed air exerting substantially constant force on the piston so that as the connector is applied to the aperture in the located printed circuit board undue force will not be applied onto the end of the connector which is being applied.

The foregoing objects and other additional objects and advantages will be apparent to those skilled in the art after a consideration of the following detailed description taken in conjunction with the accompanying drawings.

IN THE DRAWINGS

DETAILED DESCRIPTION OF PREFERRED EMBODIMENT

Figure 1:
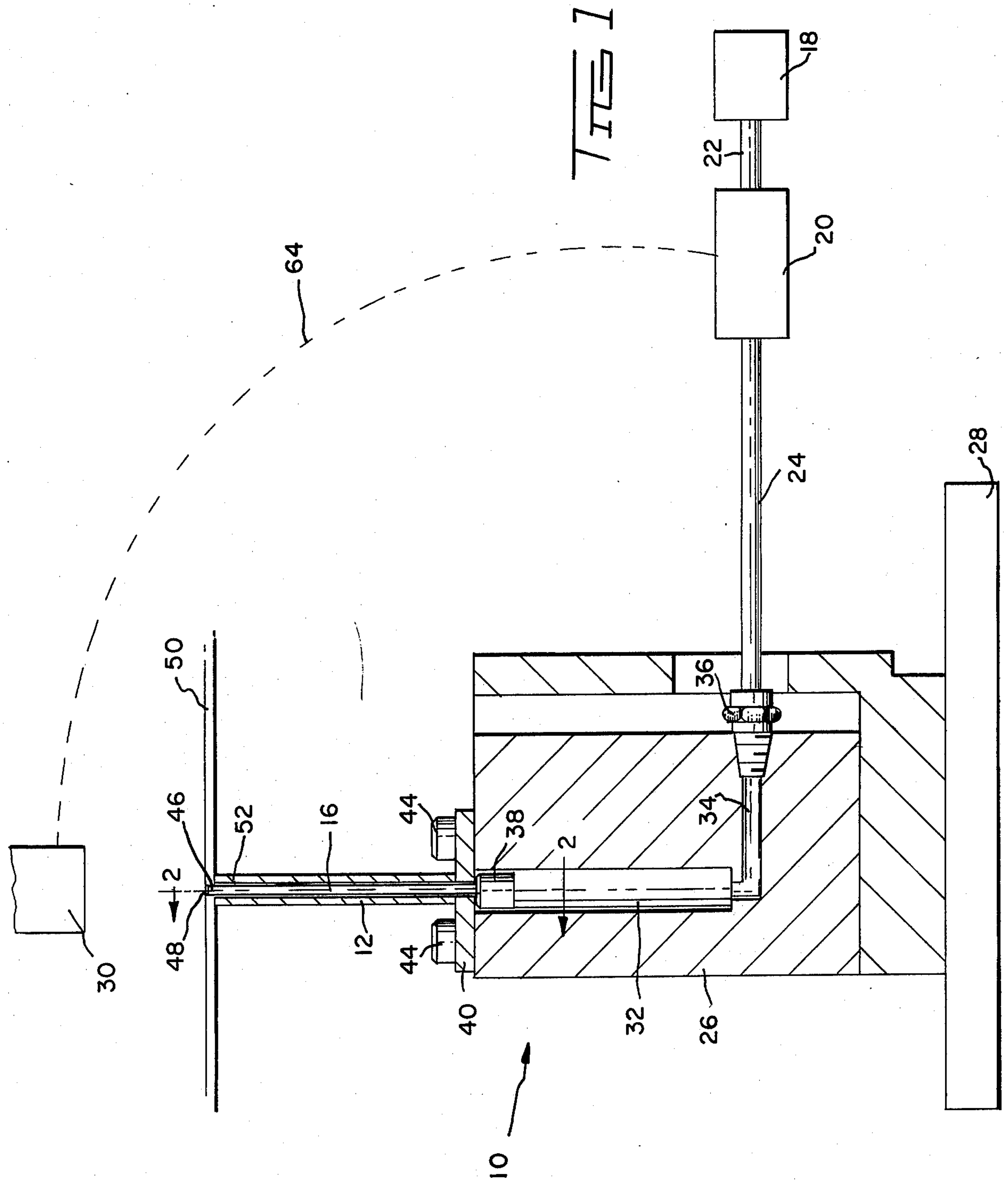
FIG. 1 is a side sectional view of the locator of this invention, the locator being shown in a position wherein it is locating an aperture within a printed circuit board prior to the application of a connector.

The locator means of this invention, which is indicated generally at 10, includes, as its principle components, a support member which may be in the form of a tube 12 having an elongated vertically extended aperture 14, pin means 16 which is slidable between a fully extended raised position shown in FIG. 1 to a retracted position, a source of compressed air 18, and means selectively interconnecting the source of compressed air 18 with the elongated aperture 14. The source of compressed air will conventionally be an air pressure line found within a factory, but may also be a suitable air compressor.

The source of compressed air 18 is interconnected with the locator by means of a valve block 20 and air lines 22 and 24, the valve block 20 providing for the selective interconnection of the source of compressed air with the locator. A mounting block 26 is mounted on the top of a bench indicated at 28 below an applicator tool 30. The applicator tool per se forms no part of the present invention, and it should be noted that such applicator tools are well known in the prior art. The mounting block 26 is provided with a vertically extending cylindrical recess 32, the lower end of which is interconnected with the air line 24 by a bore 34 and a suitable fitting 36. Piston means 38 are slidably disposed within the bore 32 and are reciprocal between a lowered position and a raised position shown in FIG. 1. The lower end of the pin means 16 is interconnected with the piston means 38 and extends outwardly from one side of the piston means. An apertured mounting plate 40 is disposed over the cylindrical recess 32 with its aperture in concentric alignment with the recess 32. The apertured mounting plate is secured to the mounting block by cap screws 44. The support member or tube 12 is in turn secured to one side of the mounting plate 40 by welding or the like and its elongated vertically extending aperture is also in concentric alignment with the aperture 42 of the mounting plate.

Figure 2:
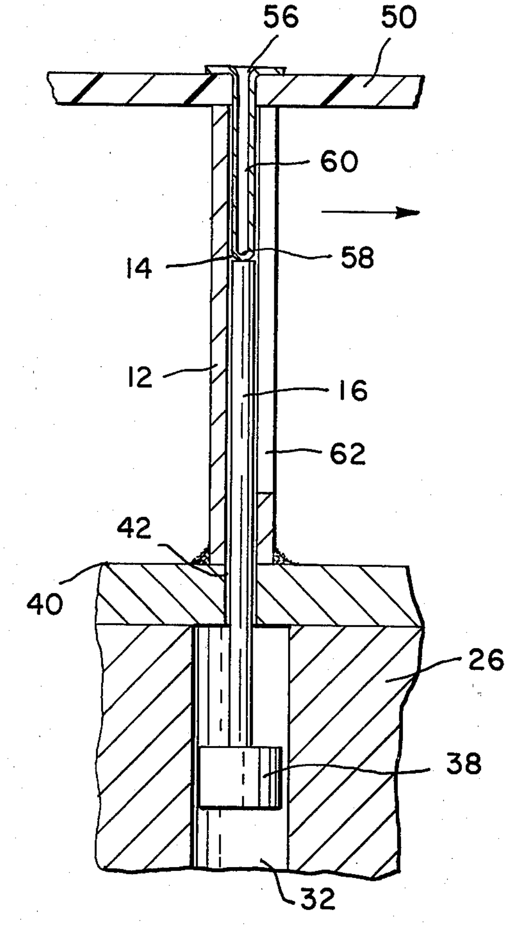
FIG. 2 is an enlarged view taken generally along the lines 2—2 showing the disposition of the locator after a connector has been applied to the aperture in the printed circuit board.

In a preferred form, which is illustrated in FIGS. 1 and 2, the piston means 38 is of a lesser diameter than the cylindrical recess 32 which will permit compressed air to flow past the piston means 38, the compressed air also serving to bias the piston means 38 to its upper position shown in FIG. 1. Similarly, the pin means 16 is of a diameter less than the diameter of the elongated vertically extending aperture 14 within the support member 12 to also permit air to flow between the pin means and the side walls of the aperture 14. Thus, when the valve 20 is open to permit the flow of compressed air from the source 18 into the locator, air will also flow into the atmosphere through clearance between the piston means 38 and recess 32 and the clearance between the pin means 16 and the aperture 14 to blow away any dirt or other undesirable foreign matter which may be in the tube 12. The aperture 42 within the apertured mounting plate 40 is of the same diameter as the elongated aperture 14 in the tube 12 and this diameter is less than the diameter of the piston means 38 so that the lower surface of the plate 40 acts as a stop to limit upward movement of the piston means 38. When the piston means is in its raised position shown in FIG. 1 a portion 46 of the pin will extend beyond the end of the tube 12. In this connection, it should be noted that the pin 16 is longer than the combined length of the apertures in the mounting plate 40 and tube 12. Thus, the end portion 46 can be utilized to facilitate the locating of an aperture 48 in a printed circuit board 50, the upper end 52 of the tube 12 also serving to support the located printed circuit board.

Figure 3:
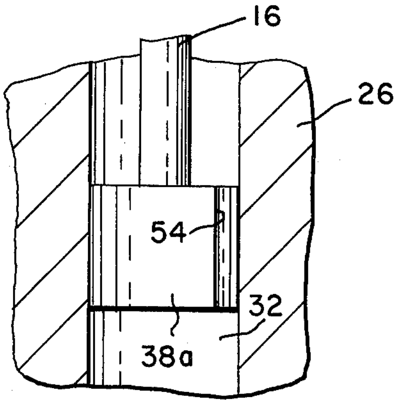
FIG. 3 is a view corresponding to a portion of FIG. 2 showing a modified form of piston construction.

In FIG. 3 a slightly modified form of a locator is illustrated, and in this form the piston means 38*a* has substantially the same diameter as the cylindrical bore 32 as is conventional with piston/cylinder design. However, the piston 38*a* is provided with a bore 54 which extends from one side of the piston to the other to provide for the flow of a certain amount of compressed air from the high pressure or lower side of the piston means 38*a* to the low pressure or upper side so that air may be utilized to clean out the recess or aperture 14 in the tube 12. Other obvious modifications in the design of this invention will be apparent to those skilled in the art.

OPERATION

In operation the valve 20 is initially opened to introduce compressed air to the lower end of the cylindrical recess 32 which will then force the piston means 38 upwardly until it abuts against the lower surface of the aperture mounting plate 40. While the valve is still open, air will flow around the piston means 38 in the embodiment shown in FIGS. 1 and 2 or through the bore 54 in the modification shown in FIG. 3 and between the side walls of the elongated aperture 14 and the pin means 16 to blow out any residue which may be in the tube 12. The aperture 48 of a printed circuit board 50 is then located about the end section 46 of the pin which extends above the tube 12. At this time the operation of the connector applicator 30 will be initiated to apply a connector 56, (which may be of the type shown in U.S. Pat. No. Re. 26,537 issued Mar. 24, 1970 to W. R. Evans, or may be of many other types) a leading end of the connector being forced through and beyond the printed circuit board. During this stage of the operation the valve means will remain open and the end 58 of the leading end portion 60 of the connector will bear against the end portion 46 of the pin means 16 forcing it downwardly within the tube against substantially constant air pressure. The tube will support the connector and prevent it from being bent towards one side or the other. Upon completion of the terminal insertion operation the leading end portion may be withdrawn from the tube by moving the printed circuit board in a direction opposed to the movement of the connector as it was applied to the board, or, the tube may be provided with a slot 62 (FIG. 2) and the connector may be moved laterally out of the support member 12. It may be desirable to shut off the supply of air prior to the withdrawal of the connector from the support member and to this end a control circuit indicated by the broken line 64 may interconnect the applicator tool with the valve means 20 to automatically shut off the supply of air to the recess 32 upon the completion of the connector insertion operation so that the pin means falls to its retracted positions by gravity. Alternatively, the valve may be shut off manually or by operation of a foot control switch not shown.

While preferred structures in which the principles of the present invention have been incorporated are shown and described above, it is to be understood that the invention is not to be limited to the particular details, shown and described above, but that, in fact, widely different means may be employed in the practice of this invention.

What is claimed is:

1. In combination with an applicator adapted to apply electrical connectors or the like to a printed circuit board, said connectors or the like having a portion which is adapted to extend through and beyond an aperture in said printed circuit board, the combination therewith of locator means adapted to locate an aperture in said printed circuit board with respect to said applicator; said locator means comprising:

a support member provided with an elongated vertically extending aperture;

pin means slidable within said aperture between a lowered position and a raised locating position wherein an end portion of said pin means extends above said support member to facilitate locating an aperture in the printed circuit board relative to said applicator, there being clearance between said pin means and the side walls of the aperture to permit air to flow therebetween;

a source of compressed air; and interconnecting means for interconnecting the source of compressed air with said aperture;

the parts being so arranged and constructed that the compressed air when interconnected with said aperture will normally bias the pin means into its raised locating position, a portion of the compressed air flowing through the clearance between the pin means and the side walls of the aperture to blow any undesirable matter out of said aperture, one end of the portion of the connector or the like which is adapted to extend through and beyond the aperture in the printed circuit board contacting the end portion of the pin means to force it within the aperture against substantially constant pressure as the connector is applied, the side walls of the aperture in the support member also serving to support said portion of the connector or the like as it is applied.

2. The combination set forth in claim 1 in which the interconnecting means is provided with valve means to provide for selective interconnection of the source of compressed air with the aperture, said pin means being biased towards its lowered position by gravity when the aperture is not interconnected with the source of compressed air.

3. The combination set forth in claim 1 wherein said support member is an elongated tube having a slot along one side to permit said portion of said connector or the like to be removed laterally of said support member.

4. The combination set forth in claim 1 wherein stop means are provided to limit the upward movement of said pin means within said aperture.

5. The combination set forth in claim 1 in which said interconnecting means includes a mounting block provided with a cylindrical recess in alignment with said aperture, and further characterized by the provision of piston means slidable within said cylindrical recess between lowered and raised positions, said pin means being interconnected with said piston means, and said piston means providing for the flow of air into the aperture in said support member.

6. The combination set forth in claim 5 wherein clearance is provided between said piston means and said cylindrical recess.

7. The combination set forth in claim 5 wherein said piston means is provided with an aperture to permit the flow of compressed air from one side of said piston means to the other.

8. The combination set forth in claim 5 in which said support member is a tube, and further characterized by the provision of an apertured mounting plate secured to said mounting block with the aperture in said mounting plate in alignment with the cylindrical recess in said mounting block, said tube being secured to one side of said mounting plate with the elongated aperture being in alignment with the aperture in said mounting plate, the diameters of the aperture in the mounting plate and the elongated aperture in the tube being substantially the same, and both being less than the diameter of the cylindrical recess in the mounting block, the other side of said mounting plate acting as a stop to limit the movement of the piston means to its raised position.

9. The combination set forth in claim 8 wherein said tube is provided with a slot along one side to permit said portion of the connector or the like to be removed laterally of said support member.

10. In combination with an applicator adapted to apply connectors or the like to a printed circuit board, said connectors or the like having a portion which is adapted to extend through and beyond an aperture in said printed circuit board, the combination therewith of locator means adapted to locate an aperture in said printed circuit board with respect to said applicator; said locator means comprising:

a mounting block defining a cylindrical recess of a first diameter;

piston means slidable within said cylindrical recess for movement between first and second positions, said piston means having a second diameter sufficiently less than said first diameter to permit air to flow between said piston means and the side walls of the cylindrical recess;

a tube extending away from said mounting block and having an elongated aperture therein in alignment with said cylindrical recess, said elongated aperture being of a third diameter which is less than said second diameter;

pin means extending outwardly from one side of said piston means and slidable within said elongated aperture for movement between a first position and a second position wherein an end portion of the pin means extends outwardly of said tube to facilitate locating an aperture in the printed circuit board relative to said applicator, said pin means having a fourth diameter sufficiently less than said third diameter to permit air to flow between said pin means and the side walls of the elongated aperture;

a source of compressed air; and means selectively operable to interconnect the source of compressed air with the cylindrical recess;

the parts being so arranged and constructed that when said source of compressed air is interconnected with said cylindrical recess the piston means and pin means will be biased to their second positions, and additional air will flow between the piston means and the side walls of the cylindrical recess and also the pin means and the side walls of the elongated aperture to blow out any residue which may be in the tube, said pin means moving downwardly within the elongated aperture as a connector is inserted into a located aperture in the printed circuit board.

11. The combination set forth in claim 10 further characterized by the provision of an apertured mounting plate secured to said mounting block with the aperture in said mounting plate in alignment with the cylindrical recess in said mounting block, said tube being secured to one side of said mounting plate with the elongated aperture being in alignment with the aperture in said mounting plate, the diameters of the aperture in the mounting plate and the elongated aperture in the tube being substantially the same, said pin means having an overall length in excess of the length of the elongated aperture and the aperture in the mounting plate.

12. In combination with an applicator adapted to apply electrical connectors or the like to a printed circuit board, said connectors or the like having a portion which is adapted to extend through and beyond an aperture in said printed circuit board, the combination therewith of locator means adapted to locate an aperture in said printed circuit board with respect to said applicator; said locator means comprising:

a tube provided with an elongated aperture, the side walls of the aperture serving to support said portion of a connector or the like as it is applied to the printed circuit board, said tube being provided with a slot along one side to permit said portion of the connector or the like to be removed laterally of said tube;

pin means slidable within said aperture between a lowered position and a raised locating position wherein an end portion of said pin means extends above said tube to facilitate locating an aperture in the printed circuit board relative to said applicator;

a mounting block provided with a cylindrical recess in alignment with said aperture;

piston means slidable within said cylindrical recess between lowered and raised positions, said pin means being interconnected with said piston means, and said piston means providing for the flow of air into the aperture in said tube;

an apertured mounting plate secured to said mounting block with the aperture in said mounting plate in alignment with the cylindrical recess in said mounting block, said tube being secured to one side of said mounting plate with the elongated aperture being in alignment with the aperture in said mounting plate, the diameter of the aperture in the mounting plate being less than the diameter of the cylindrical recess, and the other side of said mounting plate acting as a stop to limit the movement of the piston means to its raised position;

a source of compressed air; and interconnecting means for interconnecting the source of compressed air with the cylindrical recess;

the parts being so arranged and constructed that the compressed air when interconnected with said cylindrical recess will normally bias the piston means into its raised position, a portion of the compressed air flowing into the aperture in the tube means to blow any undesirable matter out of said aperture.

* * * * *